United States Patent
Lee et al.

(10) Patent No.: US 12,080,769 B2
(45) Date of Patent: Sep. 3, 2024

(54) CONTACT STRUCTURE WITH SILICIDE AND METHOD FOR FORMING THE SAME

(71) Applicant: Taiwan Semiconductor Manufacturing Company, Ltd., Hsinchu (TW)

(72) Inventors: Kai-Hsuan Lee, Hsinchu (TW); Shih-Che Lin, Hsinchu (TW); Po-Yu Huang, Hsinchu (TW); Shih-Chieh Wu, Hsinchu (TW); I-Wen Wu, Hsinchu (TW); Chen-Ming Lee, Taoyuan (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 100 days.

(21) Appl. No.: 17/672,098

(22) Filed: Feb. 15, 2022

(65) Prior Publication Data

US 2023/0261068 A1 Aug. 17, 2023

(51) Int. Cl.
| | |
|---|---|
| H01L 29/417 | (2006.01) |
| H01L 27/088 | (2006.01) |
| H01L 29/66 | (2006.01) |
| H01L 29/78 | (2006.01) |

(52) U.S. Cl.
CPC .... *H01L 29/41791* (2013.01); *H01L 27/0886* (2013.01); *H01L 29/6656* (2013.01); *H01L 29/66795* (2013.01); *H01L 29/7851* (2013.01)

(58) Field of Classification Search
CPC .......... H01L 29/6656; H01L 29/41791; H01L 27/0886; H01L 29/66795; H01L 21/823814; H01L 2029/7858
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

*Primary Examiner* — Vu A Vu
*Assistant Examiner* — Valerie N Newton
(74) *Attorney, Agent, or Firm* — McClure, Qualey & Rodack, LLP

(57) ABSTRACT

A semiconductor device structure is provided. The semiconductor device structure includes a source/drain region formed in a semiconductor substrate, a source/drain contact structure formed over the source/drain region, and a gate electrode layer formed adjacent to the source/drain contact structure. The semiconductor device structure also includes a first spacer and a second spacer laterally and successively arranged from the sidewall of the gate electrode layer to the sidewall of the source/drain contact structure. The semiconductor device structure further includes a silicide region formed in the source/drain region. The top width of the silicide region is greater than the bottom width of the source/drain contact structure and less than the top width of the source/drain region.

20 Claims, 16 Drawing Sheets

(56) References Cited

U.S. PATENT DOCUMENTS

| | | |
|---|---|---|
| 9,576,814 B2 | 2/2017 | Wu et al. |
| 2015/0357431 A1* | 12/2015 | Hung .................. H01L 29/7839 |
| | | 438/283 |
| 2019/0043959 A1* | 2/2019 | Lee ..................... H01L 29/6656 |
| 2019/0296124 A1* | 9/2019 | Hsu ................... H01L 21/31105 |

* cited by examiner

CONTACT STRUCTURE WITH SILICIDE AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The advantages of a FinFET include a reduction of the short channel effect and a higher current flow.

Although existing FinFET manufacturing processes have generally been adequate for their intended purposes, they have not been entirely satisfactory in all respects, especially as device scaling-down continues. For example, it is a challenge to a semiconductor device structure with reduced parasitic capacitance and resistance while keeping the critical dimensional (CD) of the source/drain contact of the FinFET at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 2G-1 and 2H-1 illustrate cross-sectional representations of various stages of manufacturing a semiconductor device structure in accordance with some embodiments.

DETAILED DESCRIPTION

Figure 1A:
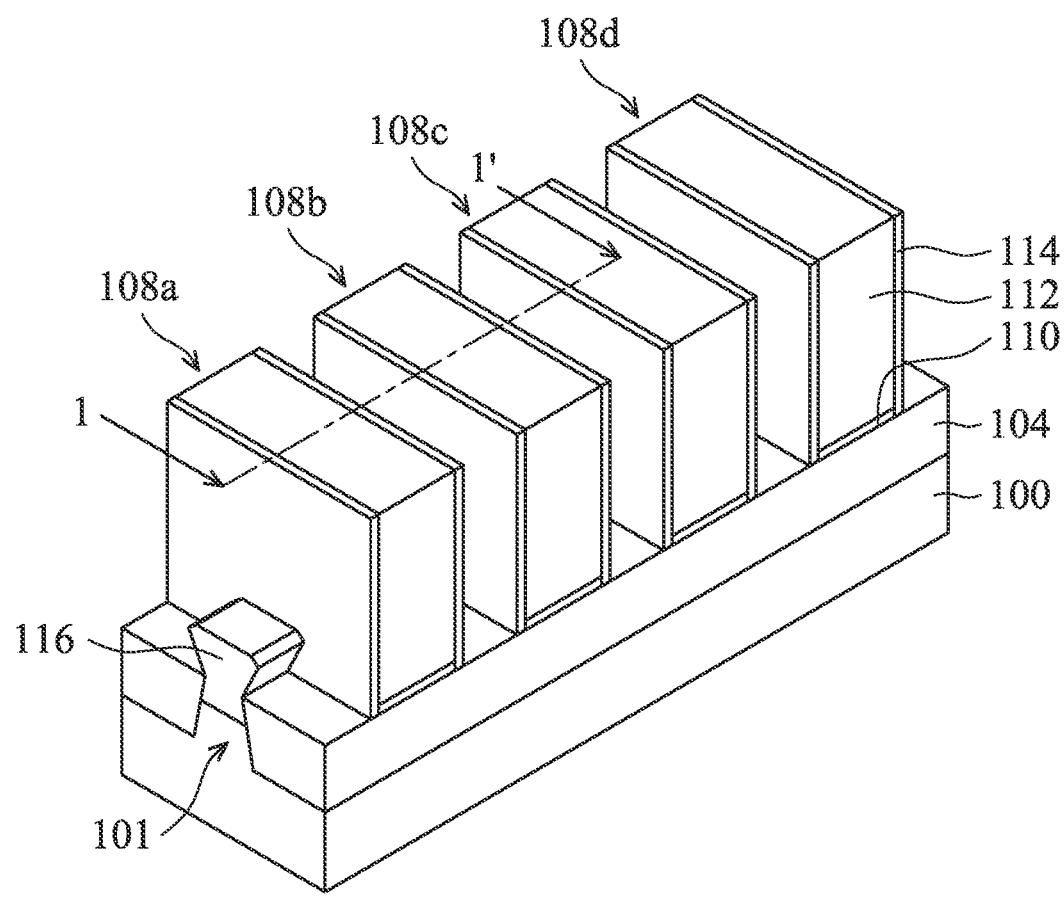
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include a gate electrode layer and a source/drain contact structure over a semiconductor substrate and adjacent to each other. A spacer structure is formed to separate the gate electrode layer from the source/drain contact structure, in which the spacer structure includes a first spacer, a second spacer, and a third spacer laterally and successively arranged from the sidewall of the gate electrode layer to the sidewall of the source/drain contact structure. A source/drain region is formed in the semiconductor substrate below the source/drain contact structure and is self-aligned to the first spacer of the spacer structure. A silicide region is formed in the source-drain region, self-aligned to the second spacer of the spacer structure and covers the bottom of the third spacer of the spacer structure. The formation of the semiconductor device structures includes forming a gate structure with the first spacer and the second spacer in an insulating layer. Afterwards, an opening is formed in the insulating layer and self-aligned to the second spacer to expose the source/drain region that is self-aligned to the first spacer. Afterwards, the silicide region is formed in the source/drain region through the opening, and then the third spacer and the source/drain contact structure are successively formed in the opening. In such a semiconductor device structure, the top width of the silicide region is greater than the bottom width of the source/drain contact structure and less than the top width of the source/drain region. Therefore, the semiconductor device structure has a lower parasitic resistance (Re) induced by the silicide region than the case where the top width of the silicide region is equal to the bottom width of the source/drain contact structure. Moreover, the semiconductor device structure with a lower parasitic resistance (Re) also has a lower parasitic capacitance ($R_c$) between the gate electrode layer and the source/drain contact structure than the case where the top width of the silicide region less than the top width of the source/drain region.

FIGS. 1A to 1D illustrate perspective views of various stages of manufacturing a semiconductor device structure. FIGS. 2A to 2L illustrate cross-sectional representations of various stages of manufacturing a semiconductor device structure in accordance with some embodiments, in which FIGS. 2A to 2D illustrate the cross-sectional representations of the semiconductor device structure shown along line 1-1' in FIGS. 1A to 1D in accordance with some embodiments. In addition, FIGS. 3A to 3I illustrate cross-sectional representations of various stages of manufacturing a semiconductor device structure in accordance with some embodiments, in which FIG. 3A illustrates the cross-sectional representation of the semiconductor device structure shown along line 2-2' in FIG. 1D in accordance with some embodiments. In some embodiments, the semiconductor device structure is implemented as a fin field effect transistor (FinFET) structure.

Figure 2A:
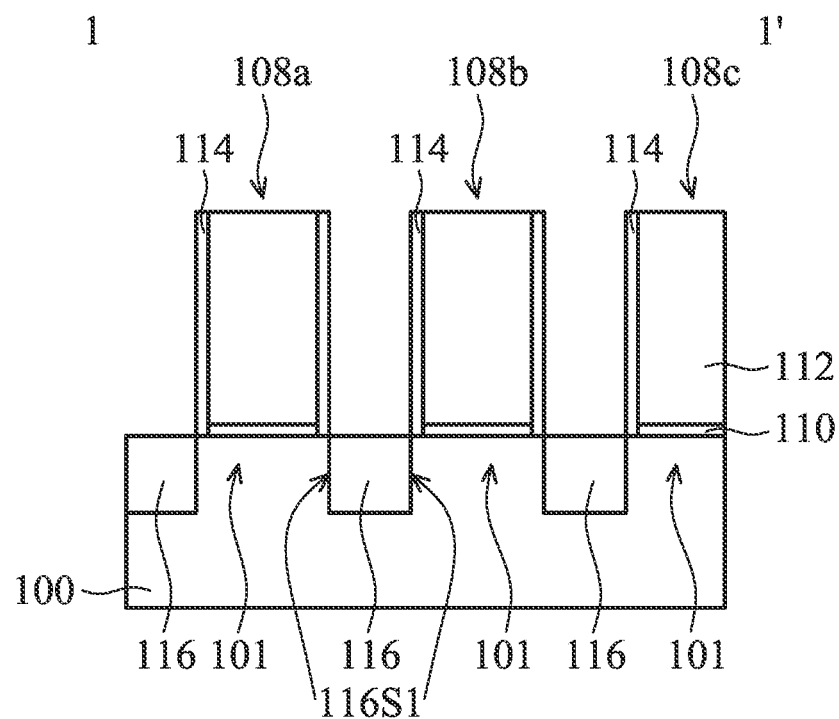
FIGS. 2A to 2L illustrate cross-sectional representations of various stages of manufacturing a semiconductor device structure in accordance with some embodiments.
Figure 3A:
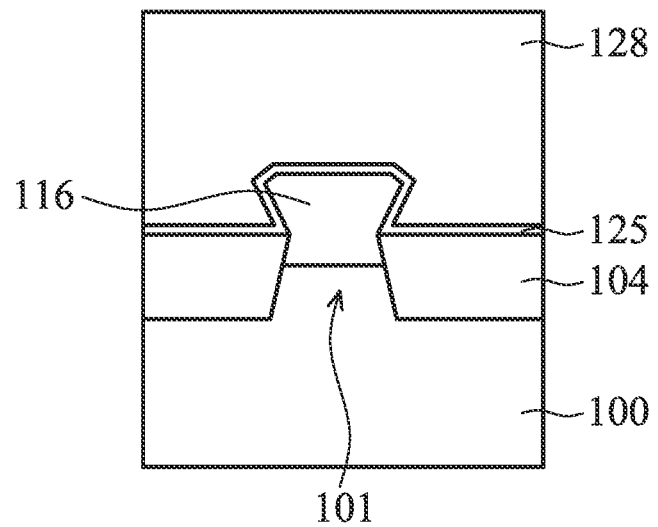
FIGS. 3A to 3I illustrate cross-sectional representations of various stages of manufacturing a semiconductor device structure in accordance with some embodiments.

As shown in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. In some embodiments, the substrate 100 is a wafer, such as a silicon wafer.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

The substrate 100 may have a PMOS region for P-type FinFETs formed thereon and/or an NMOS region for N-type FinFETs formed thereon. For example, the PMOS region of the substrate 100 may include Si, SiGe, SiGeB, or an III-V group semiconductor material (such as InSb, GaSb, or InGaSb). The NMOS region of the substrate 100 may include Si, SiP, SiC, SiPC, or an III-V group semiconductor material (such as InP, GaAs, AlAs, InAs, InAlAs, or InGaAs).

Afterwards, a fin structure 101 and an isolation structure 104 formed over the substrate 100 and adjacent to each other are provided, as shown in FIG. 1A in accordance with some embodiments. In some embodiments, the substrate 100 is patterned to form at least one fin structure 101 with slope sidewalls and extend from the patterned substrate 100. In some other embodiments, one or more fin structures 101 are formed with substantially vertical sidewalls and extend from the patterned substrate 100.

The isolation structure 104 is a shallow trench isolation (STI) structure, and the fin structure 101 is surrounded by and protruded above the isolation structure 104, as shown in FIG. 1A in accordance with some embodiments. For example, the isolation structure 104 may be formed by depositing an insulating layer (not shown) over the substrate 100. Afterwards, the insulating layer is recessed. The recessed insulating layer may be made of silicon oxide, silicon nitride, silicon oxynitride, fluorosilicate glass (FSG), low-K dielectric materials, and/or another suitable dielectric material and may be deposited by a flowable CVD (FCVD) process, a chemical vapor deposition (CVD) process, an atomic layer deposition (ALD) process, or another applicable process.

After the isolation structure 104 is formed, dummy gate stacks 108a, 108b, 108c, and 108d are formed across the fin structure 101 over the substrate 100 and cover the isolation structure 104, in accordance with some embodiments. Each of the dummy gate stacks 108a, 108b, 108c, and 108d may include a dummy gate dielectric layer 110 and a dummy gate electrode layer 112 formed over the dummy gate dielectric layer 110. The dummy gate dielectric layer 110 may be made of silicon oxide and the dummy gate electrode layer 112 may be made of polysilicon.

Gate spacers (i.e., spacers 114) are formed on the opposing sides (e.g., opposing sidewalls) of the dummy gate stacks 108a, 108b, 108c, and 108d after the formation of the dummy gate stacks 108a, 108b, 108c, and 108d, in accordance with some embodiments. Each of the formed spacers 114 is adjacent to the corresponding dummy gate stack (e.g., the dummy gate stack 108a, 108b, 108c, or 108d). The spacer 114 may be used for protecting the dummy gate stacks 108a, 108b, 108c, and 108d from damage or loss during subsequent processes (e.g., etching processes). The spacers 114 may be made of silicon nitride, silicon oxide, silicon oxynitride, silicon carbide, or another applicable dielectric material.

After the formation of the spacers 114, conductive features (such as source/drain regions 116) are formed in the fin structure 101 adjacent to and exposed from the dummy gate stacks 108a, 108b, 108c, and 108d with the spacers 114, as shown in FIGS. 1A and 2A in accordance with some embodiments. Namely, the source/drain region 116 is self-aligned to the spacers 114 formed on the sidewalls of the two adjacent dummy gate stacks. As a result, the sidewall of the spacer 114 is substantially aligned to the first side edge 116S1 of the source/drain region 116 extending in the longitudinal direction of the dummy gate stacks 108a, 108b, 108c, and 108d, as shown in FIG. 2A. In some embodiments, the source/drain region 116 is formed by recessing the fin structure 101 exposed from the dummy gate stacks 108a, 108b, 108c, and 108d and growing semiconductor materials in the formed recesses in the fin structure 101 by performing epitaxial (epi) growth processes.

In some embodiments, the semiconductor device structure is an NMOS device, and the source/drain regions 116 include Si, SiP, SiC, SiPC, or an III-V group semiconductor material (such as InP, GaAs, AlAs, InAs, InAlAs, or InGaAs), or the like. In some other embodiments, the semiconductor device structure is a PMOS device, and the source/drain regions 116 include Si, SiGe, SiGeB, or an III-V group semiconductor material (such as InSb, GaSb, or InGaSb), or the like. In some embodiments, each of the source/drain regions 116 protrudes above the isolation structure 104.

Figure 1B:
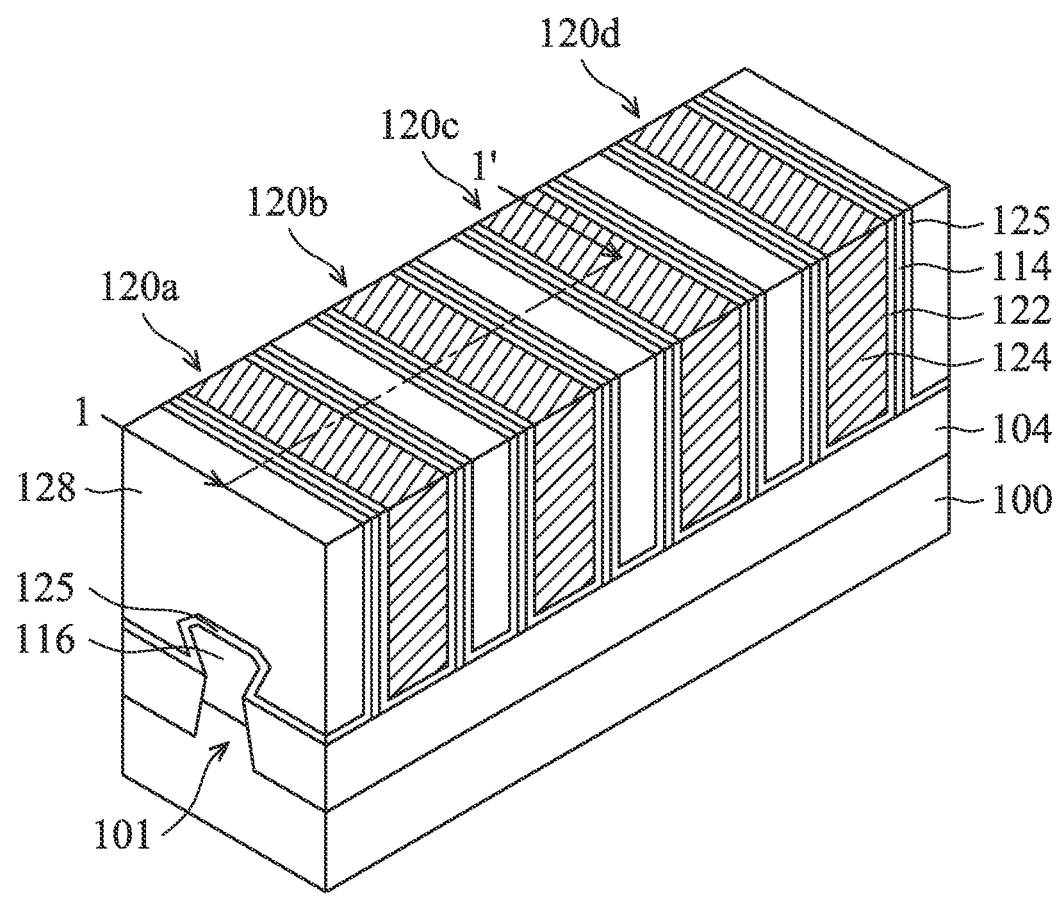
Figure 2B:
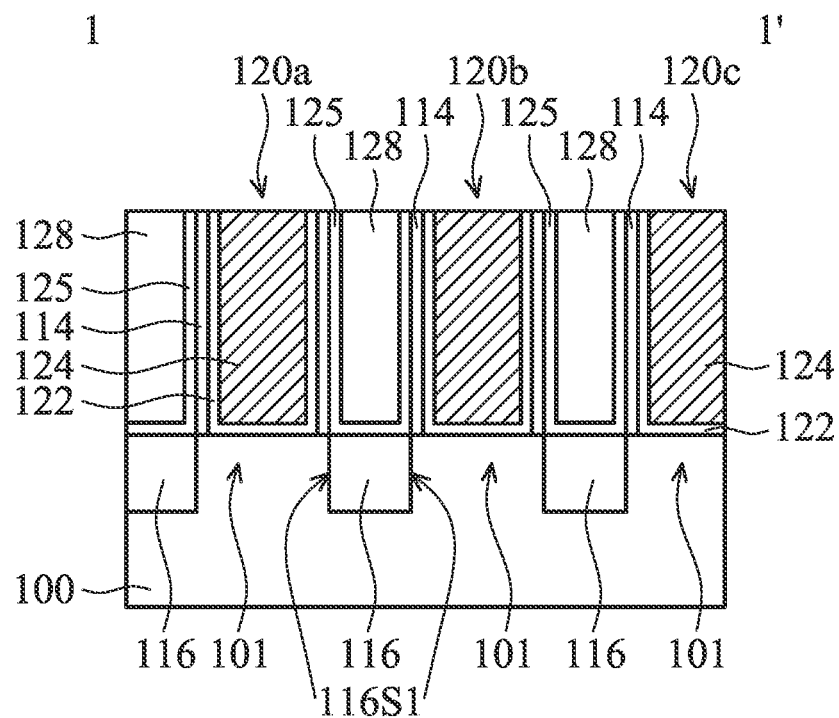

A contact etch stop layer 125 and an insulating layer 128 are successively formed over the isolation structure 104 after the source/drain regions 116 are formed, as shown in FIGS. 1B and 2B in accordance with some embodiments. The contact stop layer 125 conformally covers the spacers 114 over the opposing sidewalls of the dummy gate stacks 108a, 108b, 108c, and 108d, the source/drain regions 116, and the isolation structure 104. The contact etch stop layer 125 may be used for forming contact holes (not shown) in the source/drain regions 116 and for protecting subsequent active gate structures from damage or loss during the subsequent processes (e.g., etching processes). The contact etch stop layer 125 may be made of a material that is different from that of the spacer 114. For example, the contact etch stop layer 125 may include silicon nitride, silicon oxide, silicon carbide, silicon oxynitride, or another applicable material.

After the formation of the contact etch stop layer 125, the insulating layer 128 is deposited to cover the contact etch stop layer 125 and the structure shown in FIGS. 1A and 2A. Afterwards, a planarization process is performed to remove the excess insulating layer 128 and the contact etch stop layer 125 above the dummy gate stacks 108a, 108b, 108c, and 108d, in accordance with some embodiments. In some embodiments, such a planarization process (such as a chemical mechanical polishing (CMP) process) is performed on the insulating layer 128 until the dummy gate stacks 108a, 108b, 108c, and 108d are exposed, so that the exposed top surfaces of the dummy gate stacks 108a, 108b, 108c, and 108d are substantially level with the top surface of the remaining insulating layer 128.

The remaining insulating layer 128 (which serves as an interlayer dielectric (ILD) layer) may be made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 128 may be deposited by any suitable method, such as a chemical vapor deposition (CVD) process, a plasma enhanced CVD (PECVD) process, flowable CVD (FCVD) process, the like, or a combination thereof. The insulating layer 128 may be a single layer or include multiple dielectric layers with the same or different dielectric materials.

Afterwards, the dummy gate stacks 108a, 108b, 108c, and 108d are removed and replaced by gate stacks 120a, 120b, 120c, and 120d, as shown in FIGS. 1B and 2B in accordance with some embodiments. In some embodiments, each of the gate stacks 120a, 120b, 120c, and 120d at least includes a gate dielectric layer 122, a gate electrode layer 124. The spacers 114 and the portions of the contact etch stop layer 125 are adjacent to the corresponding gate stack.

In some embodiments, the gate dielectric layer 122 is made of high-k materials, such as metal oxides, metal nitrides, or other applicable dielectric materials. Moreover, the gate electrode layer 124 is made of a conductive material, such as aluminum, copper, tungsten, titanium, tantalum, or another applicable material. Each of the gate stacks 120a, 120b, 120c, and 120d may further include a work function metal layer (not shown) between the gate dielectric layer 122 and the gate electrode layer 124, so that the gate stacks 120a, 120b, 120c, and 120d have the proper work function values. An exemplary p-type work function metal layer may be made of TiN, TaN, Ru, Mo, Al, WN, or a combination thereof. An exemplary n-type work function metal layer may be made of Ti, Ag, TaAl, TaAlC, TiAlN, TaC, TaCN, TaSiN, Mn, Zr, or a combination thereof.

Figure 1C:
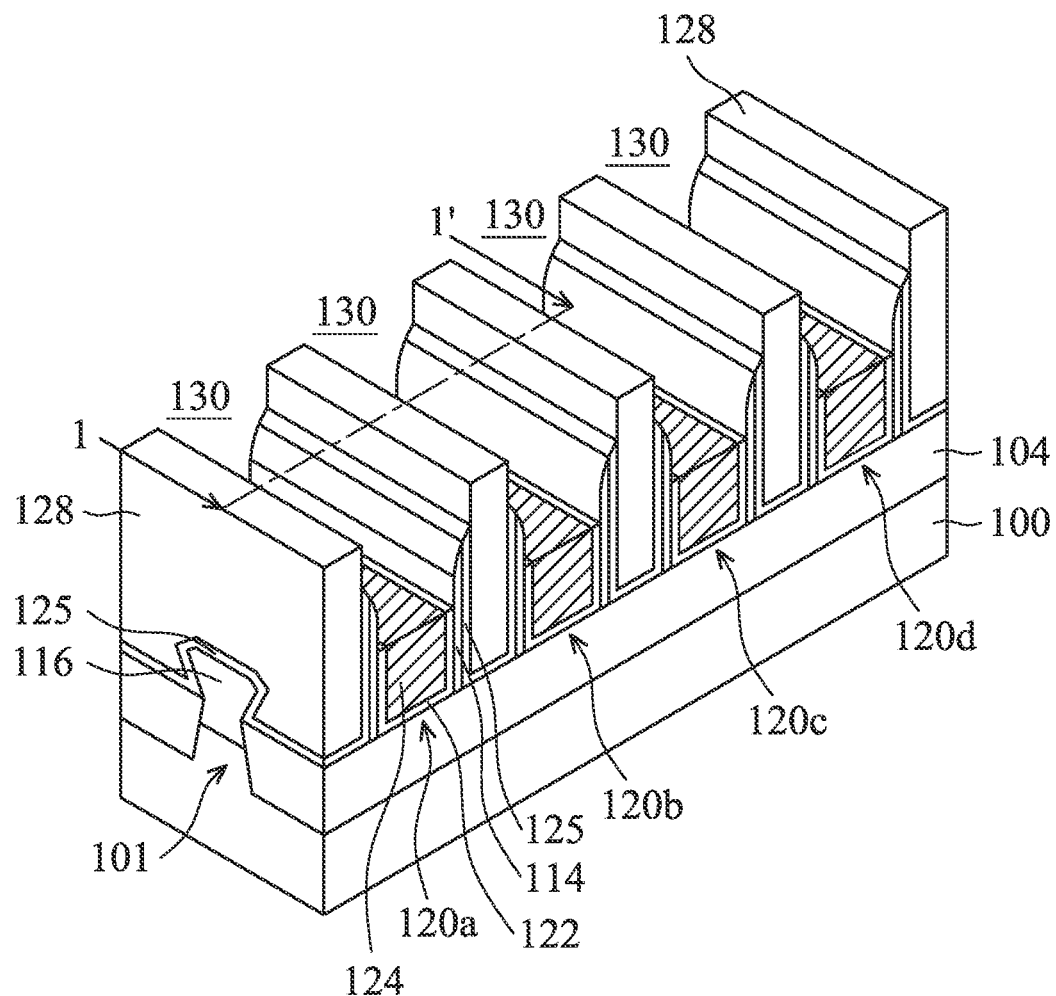
Figure 2C:
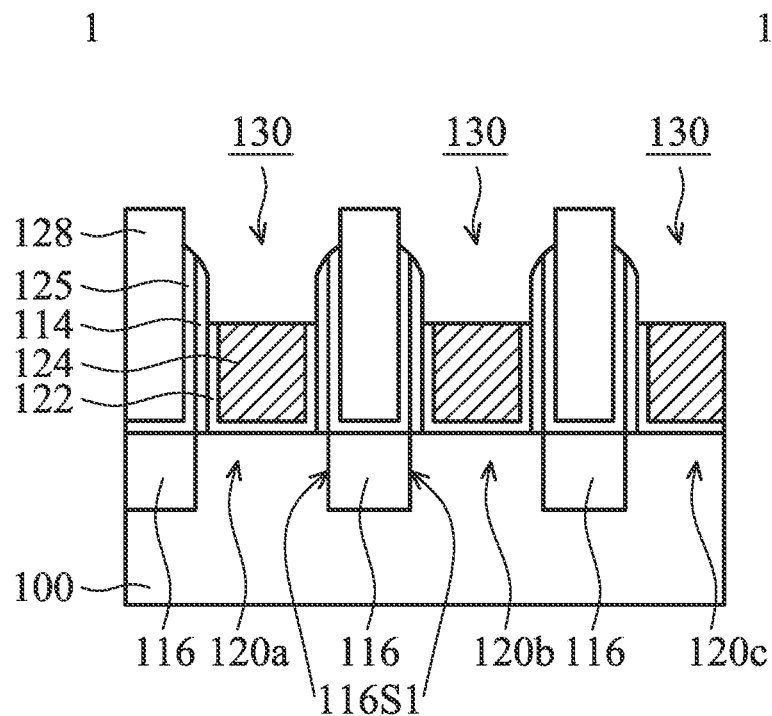

Afterwards, the gate stacks 120a, 120b, 120c, and 120d are recessed by etching, so as to form recesses 130, as shown in FIGS. 1C and 2C in accordance with some embodiments. During the etching, the top of the portions of the contact etch stop layer 125 adjacent to the spacers 114 are also recessed. In some embodiments, each of the gate electrode layers 124 is further recessed by etching after the upper sidewalls of the insulating layer 128 are exposed by the recesses 130, so that the recesses 130 are extended to form a T-shaped profile, as shown in FIG. 2C. Therefore, the upper surface of the spacers 114, the portions of the contact etch stop layer 125 adjacent to the spacers 114, and the upper surface of the gate dielectric layers 124 are higher than the upper surface of the corresponding gate electrode layers 124. As a result, the upper surface of the spacers 114 are higher than the upper surface of the gate stacks 120a, 120b, 120c, and 120d, as shown in FIGS. 1C and 2C.

In some other embodiments, an optional conductive capping layer (not shown) is formed to cover each of the recessed gate electrode layers 124. The conductive capping layers and the underlying gate electrode layer 124 form the gate stacks 120a, 120b, 120c, and 120d. In those cases, the upper surface of each spacer 114 is higher than the upper surface of the conductive capping layer. The conductive capping layers may serve as etch stop layers or protective layers for protecting the gate electrode layers 124 from damage or loss during the subsequent processes, and be made of a metal material, such as tungsten.

Figure 1D:
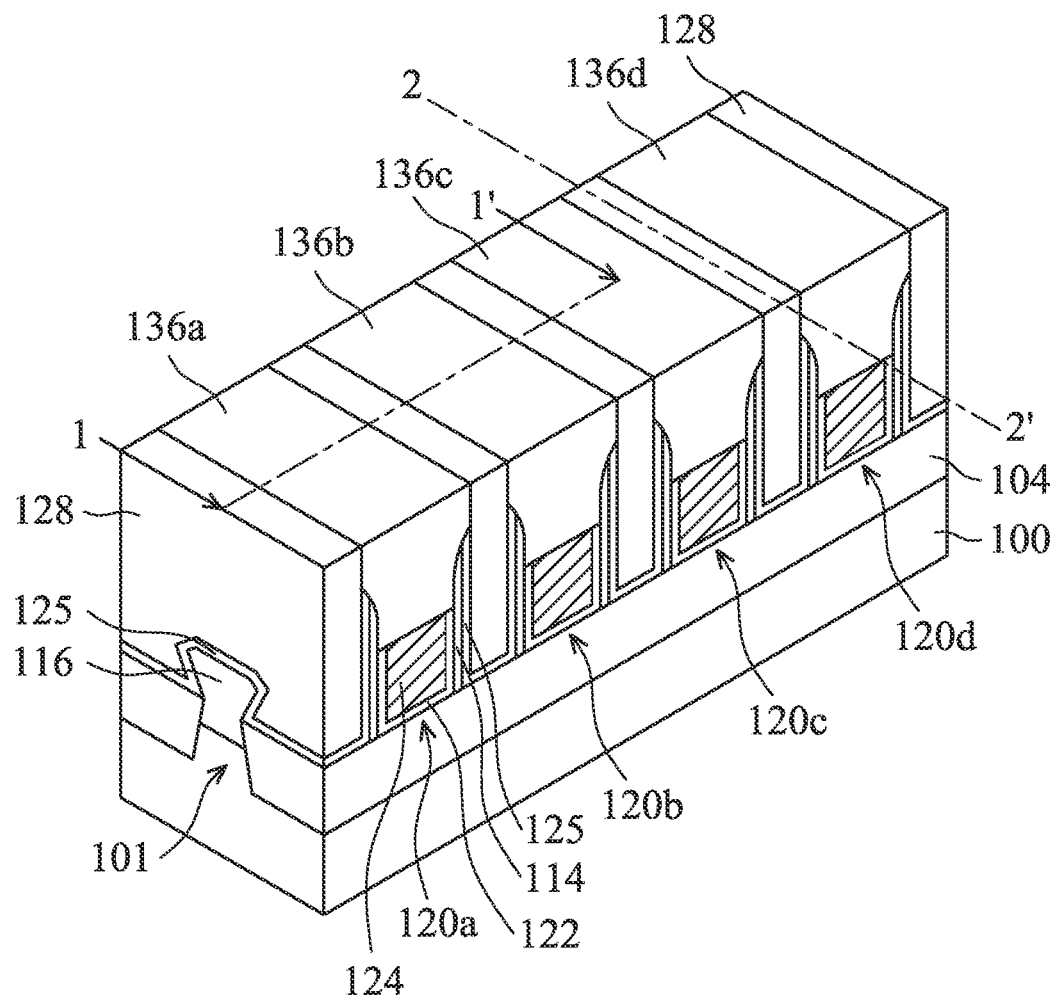
Figure 2D:
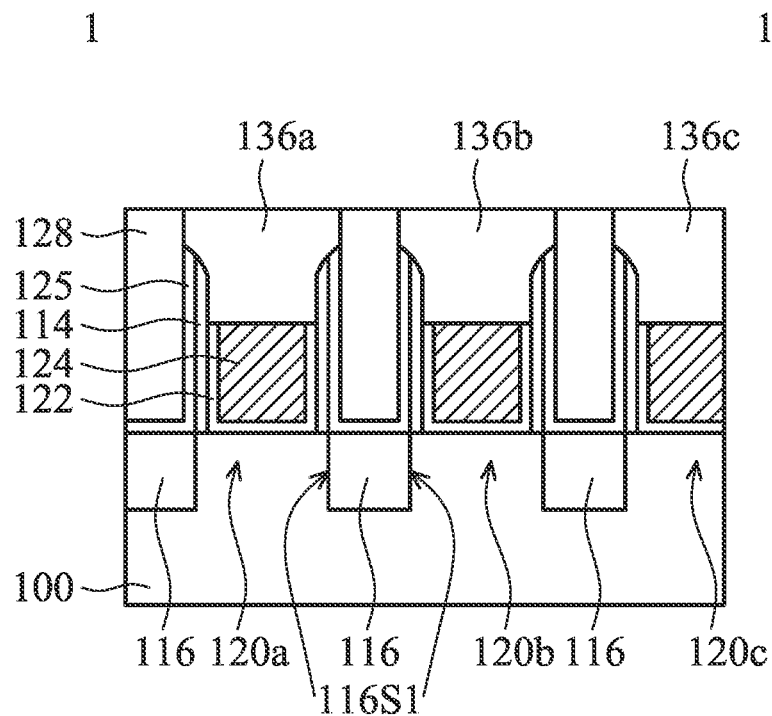

Afterwards, each of insulating capping layers 136a, 136b, 136c, and 136d are formed to fill the corresponding recess 130 (as indicated in FIGS. 1C and 2C) to cover the corresponding conductive capping layer (if presented) and the corresponding gate electrode layers 124, as shown in FIGS. 1D and 2D in accordance with some embodiments. The insulating capping layers 136a, 136b, 136c, and 136d are formed to cover the upper surfaces of the gate stacks 120a, 120b, 120c, and 120d.

In some embodiments, an insulating layer (not shown) used for formation of the insulating capping layers 136a, 136b, 136c, and 136d is formed over the structure shown in FIGS. 1C and 2C and fills the recesses 130. For example, the insulating layer is made of a different material than the material of the insulating layer 128 and includes high-k materials, such as metal oxides including $ZrO_2$, $HfO_2$, or SiN. The insulating layer may be formed by performing a chemical vapor deposition (CVD) process, a plasma enhanced CVD (PECVD) process, low-pressure CVD (LPCVD) process, an atomic layer deposition (ALD) process, or another applicable process. Afterwards, a planarization process (e.g., a chemical mechanical polishing (CMP) process) is performed to remove the excess insulating layer above the insulating layer 128 in accordance with some embodiments. After the planarization process, the remaining insulating layer forms insulating capping layers 136a, 136b, 136c, and 136d, as shown in FIGS. 1D and 2D.

In some embodiments, the upper surfaces of the insulating capping layers 136a, 136b, 136c, and 136d are substantially level with the top surface of the insulating layer 128 shown in FIG. 3A, as shown in FIGS. 1D and 2D. The insulating capping layers 136a, 136b, 136c, and 136d serve as etch stop layers and protect the gate stacks 120a, 120b, 120c, and 120d in the subsequent processes (e.g., etching processes).

Figure 2E:
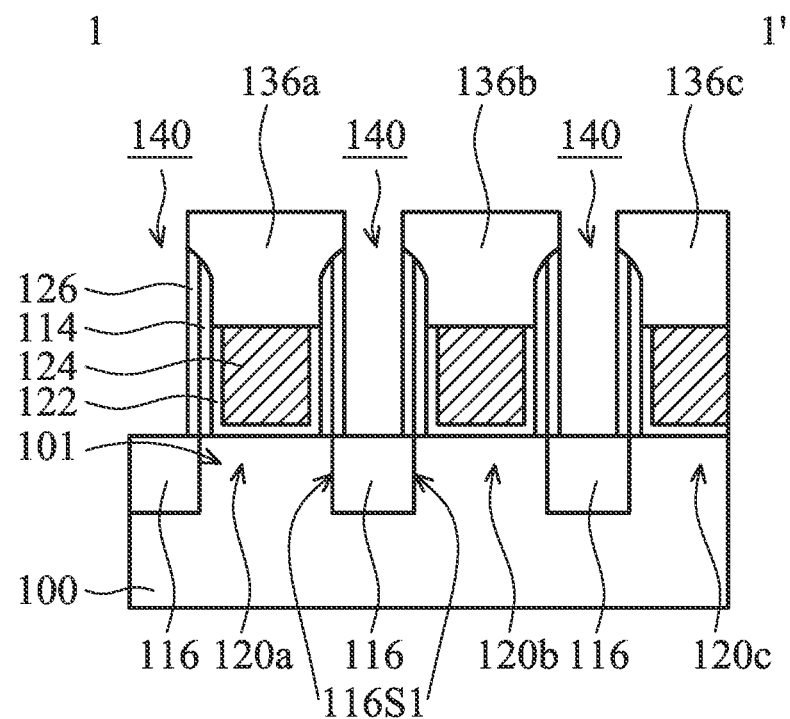
Figure 3B:
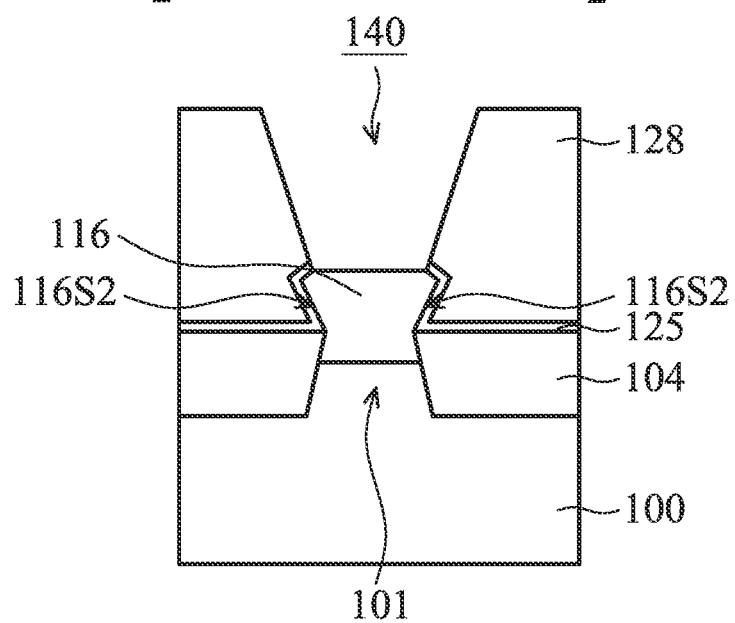

After the insulating capping layers 136a, 136b, 136c, and 136d are formed, the insulating layer 128 is patterned to form openings 140 in the insulating capping layers 136a, 136b, 136c, and 136d, respectively, as shown in FIGS. 2E and 3B. Each of the opening 140 exposes a portion of the source/drain region 116 where a silicide region is formed in the subsequent processes. In some embodiments, portions of the contact etch stop layer 125 exposed from the openings 140 are removed to expose the source/drain region 116 in a corresponding opening 140, as shown in FIGS. 2E and 3B.

Portions of the remaining contact etch stop layer 125 that covers the spacers 114 form spacers 126 on two opposing sides of each gate electrode layer 124 and on two opposing sides of each opening 140 extending in a longitudinal direction of the gate electrode layer 124, as shown in FIG. 2E. The gate electrode layer 124, the gate dielectric layer 122, and the spacers 114 and 126 form a gate structure across the fin structure 101 (as indicated in FIG. 2B). Moreover, in a transversal direction of the gate electrode layer 124 (which may be orthogonal to the longitudinal direction of the gate electrode layer 124), the remaining contact etch stop layer 125 covers a portions of a second side edge 116S2 of the source/drain region 116 and is covered by the insulating layer 128, as shown in FIG. 3B.

As a result, the spacer 114 and the spacer 126 are laterally and successively arranged from the sidewall of the gate electrode layer 134. Moreover, the interface between the spacer 114 and the spacer 126 is substantially aligned to the first side edge 116S1 of the source/drain region 116 extending in a longitudinal direction of the gate electrode layer 124 (as shown in FIG. 2E) and the second side edge 116S2 of the source/drain region 116 extending in a transversal direction of the gate electrode layer 124 is adjacent to the insulating layer 128 and in direct contact with the remaining contact etch stop layer 125 (as shown in FIG. 3B).

Figure 2F:
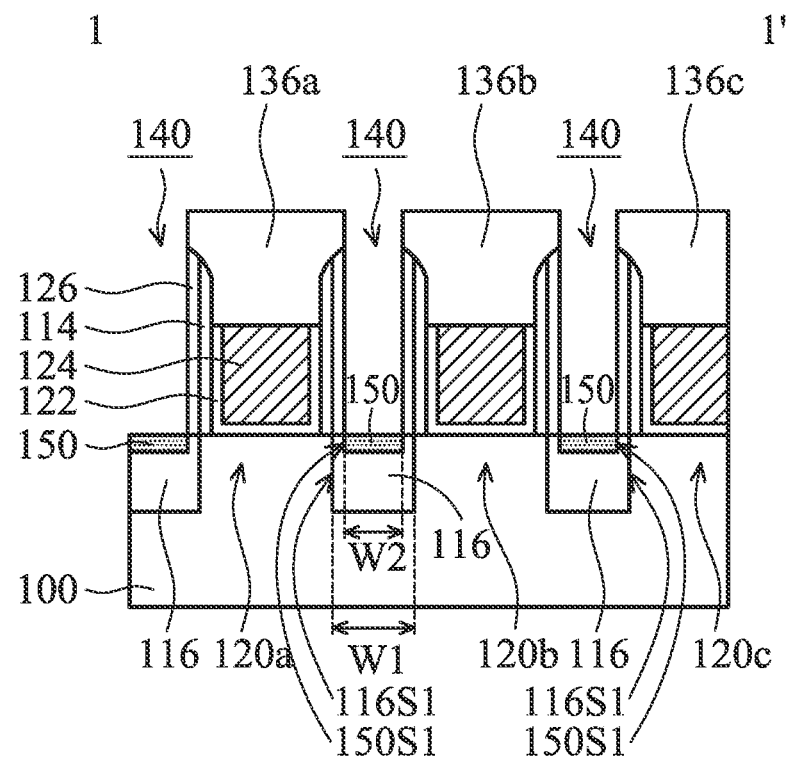
Figure 3C:
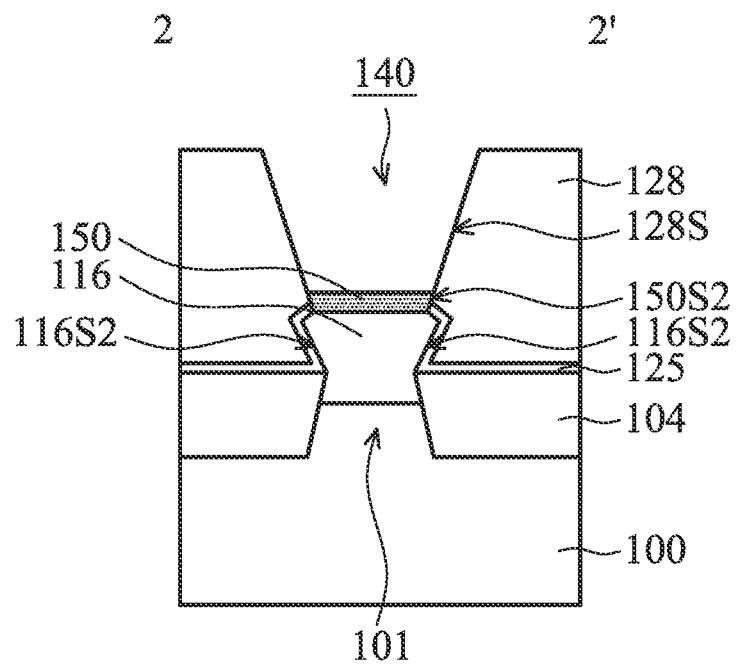

Afterwards, a salicide process may be performed to form a silicide region 150 (which is also referred to as a salicide region) in the source/drain region 116, as shown in FIGS. 2F and 3C. The silicide region 150 is self-aligned to the spacers 126 covering the sidewalls of the two adjacent gate electrode layers 124. As a result, the sidewall of the spacer 126 is substantially aligned to a first side edge 150S1 of the silicide region extending in the longitudinal direction of the gate electrode layer 124, as shown in FIG. 2F. Moreover, a sidewall 128S of the opening 140 constructed by the insulating layer 128 is substantially aligned to and in direct contact with a second side edge 150S2 of the silicide region 150 extending in the transversal direction of the gate electrode layer 124, as shown in FIG. 3C.

As a result, a top width W2 of the silicide region 150 in the transversal direction of the gate electrode layer 124 is less than a top width W1 of the source/drain region 116 in the transversal direction of the gate electrode layer 124, as shown in FIG. 2F. Namely, the first side edge 116S1 of the source/drain region 116 is laterally extended beyond the first side edge 150S1 of the silicide region 150 (as shown in FIG. 2F), and the second side edge 116S2 of the source/drain region 116 is laterally extended beyond the second side edge 150S2 of the silicide region 150 (as shown in FIG. 3C).

Since the region of the source/drain region 116 used for the silicide region 150 is defined by patterning the insulating layer 128 (i.e., by forming the opening 140), the first side edge 150S1 of the silicide region 150 and the first side edge 116S1 of the source/drain region 116 can be separated from each other by a distance (which is substantially equal to the bottom width or the thickness of the spacer 126 in the transversal direction of the gate stack 120a, 120b, 120c, or 120d. Moreover, the second side edge 150S2 of the silicide region 150 cannot extend onto the second side edge 116S2 of the source/drain region 116. As a result, the silicide landing area in the source/drain region 116 is reduced, so as to reduce the parasitic capacitance (Cp) between the gate electrode layer 124 and the subsequent formed source/drain contact structure.

In some embodiments, the silicide region 150 is formed by forming a metal layer (not shown) over the exposed top surface of the source/drain region 116. Afterwards, an annealing process is performed on the metal layer, so that the metal layer reacts with the source/drain region 116. Afterwards, the unreacted metal layer is removed to form the silicide region 150. Examples for forming the metal layer includes Ti, Co, Ni, NiCo, Pt, Ni(Pt), Ir, Pt(Ir), Er, Yb, Pd, Rh, Nb, TiSiN, and the like.

Figure 2G:
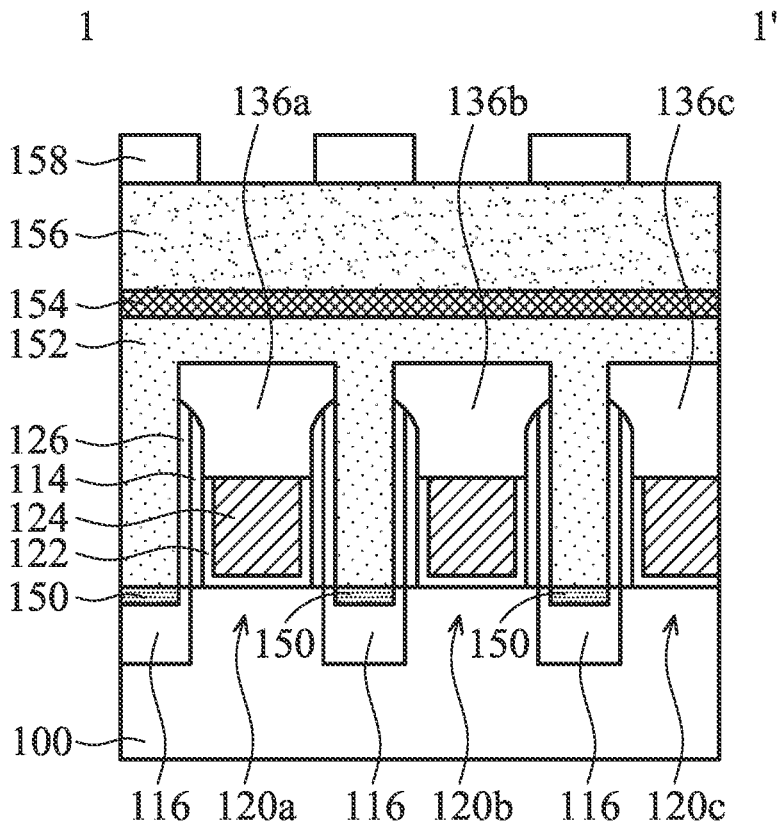
Figure 3D:
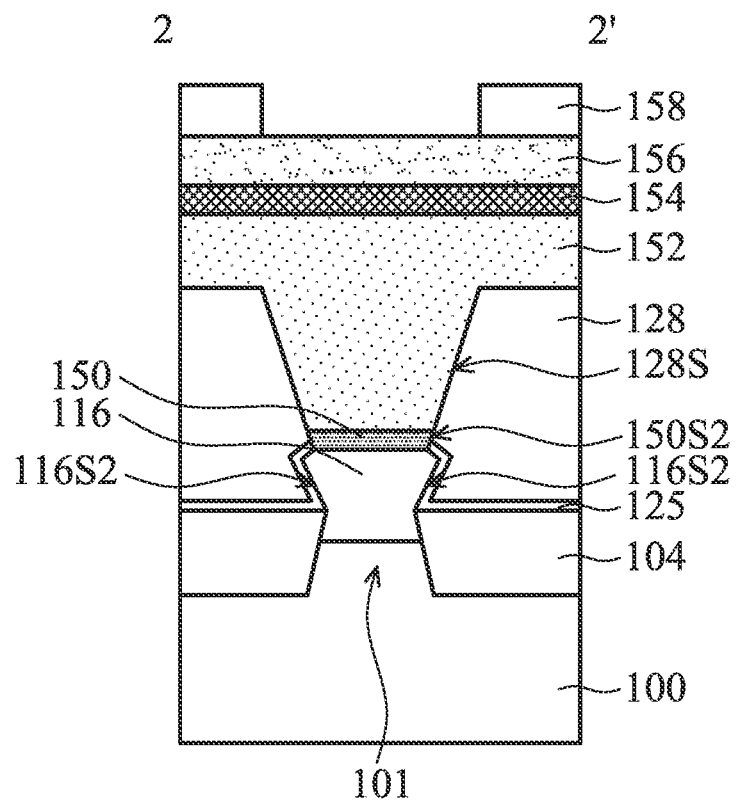

After the silicide region 150 is formed, a sacrificial layer 152 is formed over the structure shown in FIGS. 2F and 3C, and fills the openings 140. Afterwards, a hard mask structure including a first masking layer 154, a second masking layer 156, and a third masking layer 158 is formed over the sacrificial layer 152, as shown in FIGS. 2G and 3D in accordance with some embodiments. In some embodiments, the sacrificial layer 152 is patterned using the hard mask structure as an etch mask. The sacrificial layer 152 includes an insulating material different than those of the insulating capping layers 136a, 136b, 136c, and 136d and the insulating layer 128. In some embodiments, the masking layer 138 includes a tri-layer resist structure including a bottom layer (e.g., the first masking layer 154), a middle layer (e.g., the second masking layer 156), and a top layer (e.g., the third masking layer 158).

For example, the bottom layer is a first layer of the tri-layer resist structure. The bottom layer may contain a material that is patternable and/or have an anti-reflection property, such as a bottom anti-reflective coating (BARC) layer or a nitrogen-free anti-reflective coating (NFARC) layer. In some embodiments, the bottom layer is formed by a spin-on coating process, a chemical vapor deposition (CVD) process, a physical vapor deposition (PVD) process, or another suitable deposition process.

The middle layer is formed over the bottom layer and is a second layer of the tri-layer resist structure. The middle layer (which is also referred to as a hard mask layer) provides hard mask properties for the photolithography process. In addition, the middle layer is designed to provide etching selectivity from the bottom layer and the top layer. In some embodiments, the middle layer is made of silicon oxide, silicon nitride, or silicon oxynitride and is formed by a spin-on coating process, a chemical vapor deposition (CVD) process, a physical vapor deposition (PVD) process, or another suitable deposition process.

The top layer is formed over the middle layer and is a third layer of the tri-layer resist structure. The top layer may be positive photoresist or negative photoresist. In some other embodiments, the tri-layer resist structure includes oxide-nitride-oxide (ONO) layers.

Afterwards, the top layer (e.g., the third masking layer 158) is patterned to form a first pattern therein, as shown in FIGS. 2G and 3D in accordance with some embodiments.

Figure 2H:
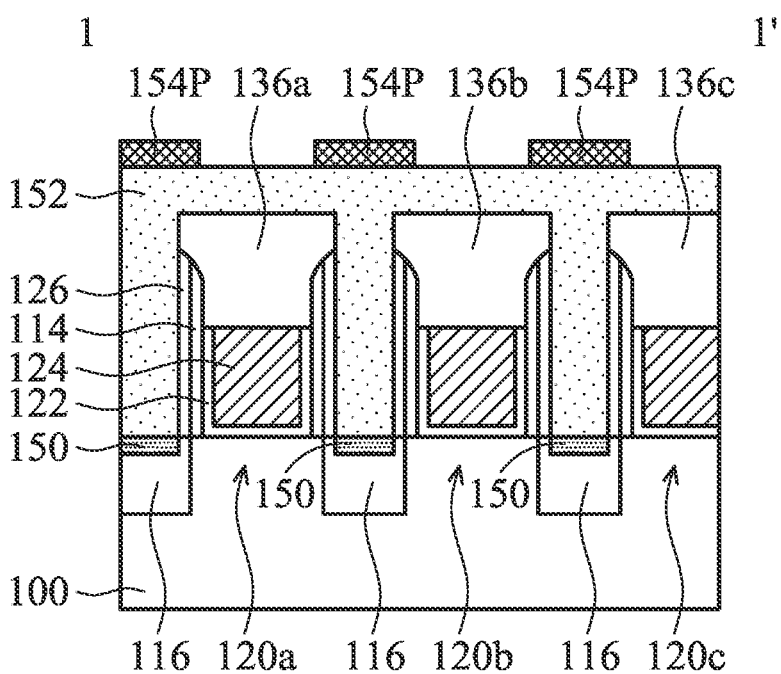
Figure 3E:
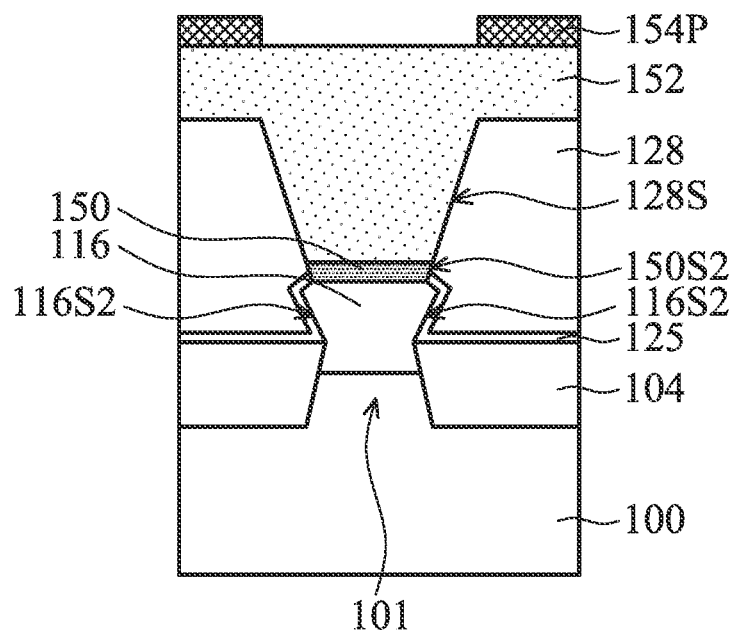

After the first pattern is formed in the third masking layer 158, the first pattern is successively transferred to the second masking layer 156 and the first masking layer 154, so as to form a patterned first masking layer 154p with a second pattern therein, as shown in FIGS. 2H and 3E in accordance with some embodiments. The patterned first masking layer 154p may be formed by a removing process that includes one or more etching processes. After the formation of the patterned first masking layer 154p, the third masking layer 158 and the second masking layer 156 are removed and a portion of the sacrificial layer 152 is exposed from the patterned first masking layer 154p.

Figure 2I:
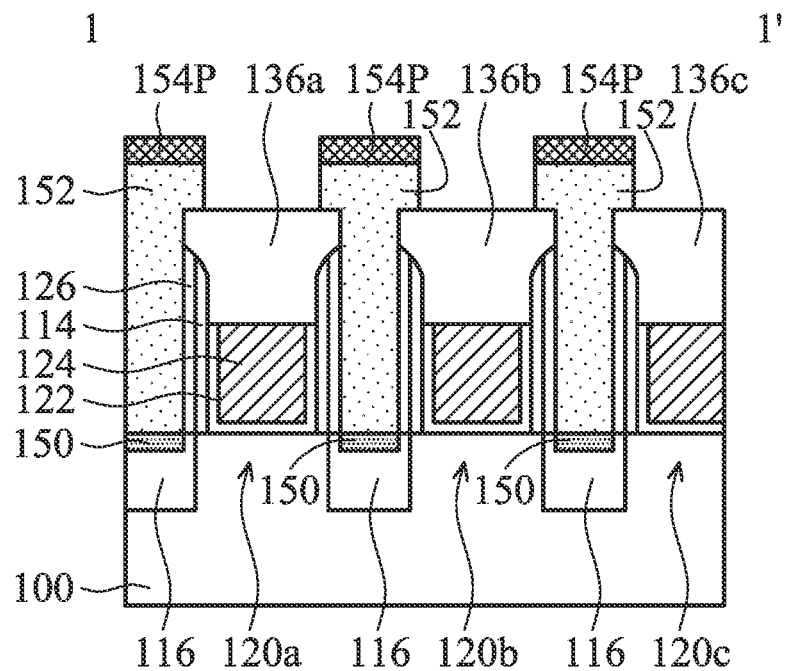
Figure 3F:
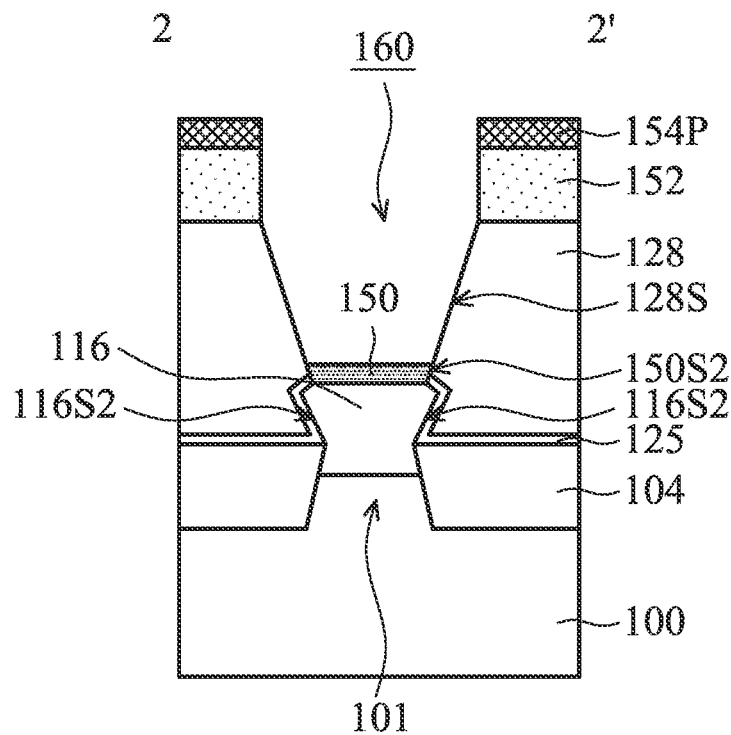

An etching process is performed on the exposed sacrificial layer 152 using the patterned first masking layer 154p as an etch mask, as shown in FIGS. 2I and 3F in accordance with some embodiments. After the etching process is performed, an opening 160 is formed through the sacrificial layer 152 and the underlying insulating layer 128 to expose the top surface of silicide region 150, as shown in FIG. 3F in accordance with some embodiments. During the opening 160 is formed, the insulating capping layers 136a, 136b, 136c, and 136d (which is not shown in FIGS. 2I and 3F) are also used as etch masks for protecting the gate stacks 120a, 120b, 120c, and 120d (which is not shown in FIGS. 2I and 3F).

Figure 2J:
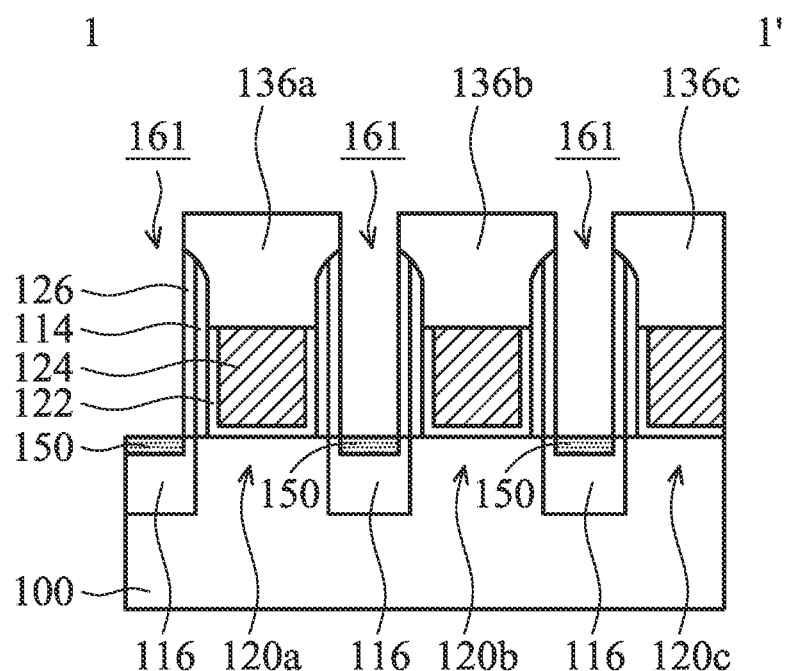
Figure 3G:
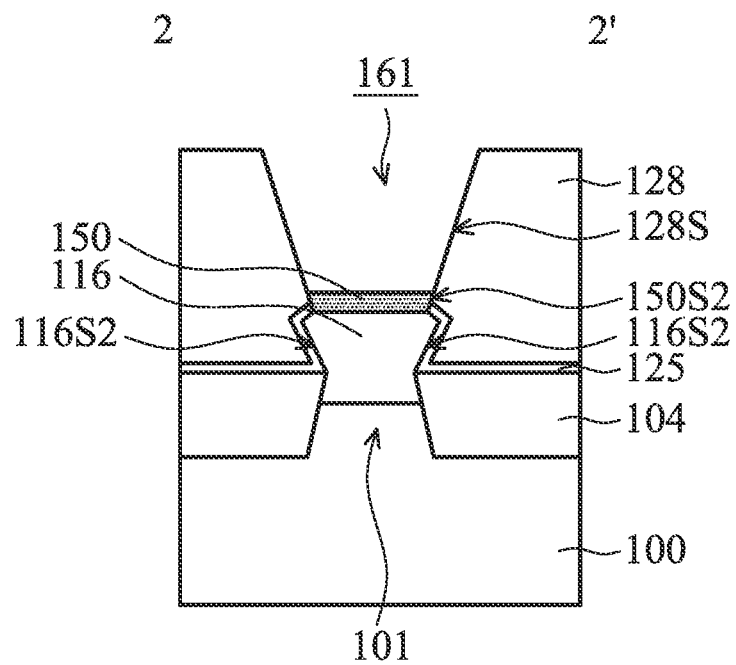

Afterwards, the patterned first masking layer 154p and the remaining sacrificial layer 152 are removed by one or more etching processes, as shown in FIGS. 2J and 3G in accordance with some embodiments. As a result, openings 161 are formed in the insulating layer 128 between the gate structures (which includes gate stacks 120a, 120b, 120c, and 120d with spacers 114 and 126) to expose top surfaces of each silicide region 150 covered by the remaining sacrificial layer 152 and sidewalls of the spacers 126, as shown in FIG. 2J.

Figure 2K:
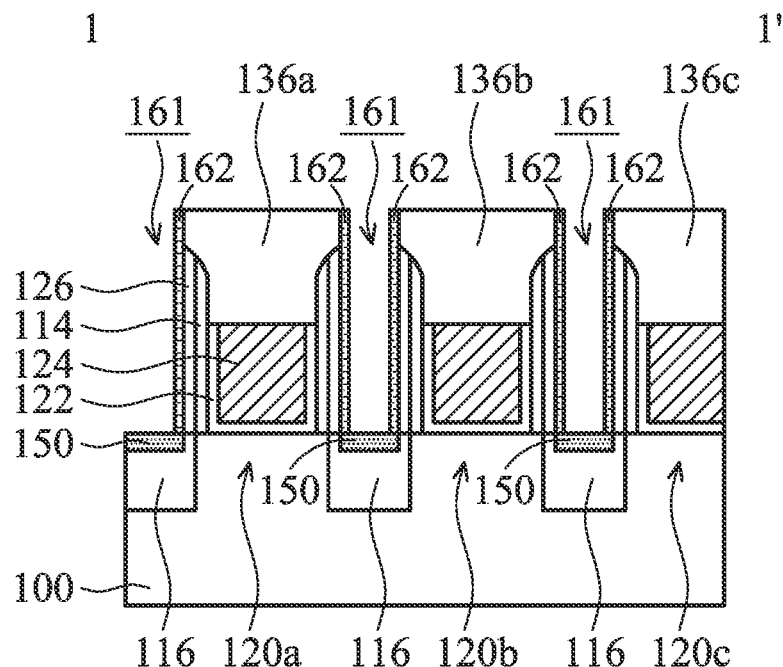
Figure 3H:
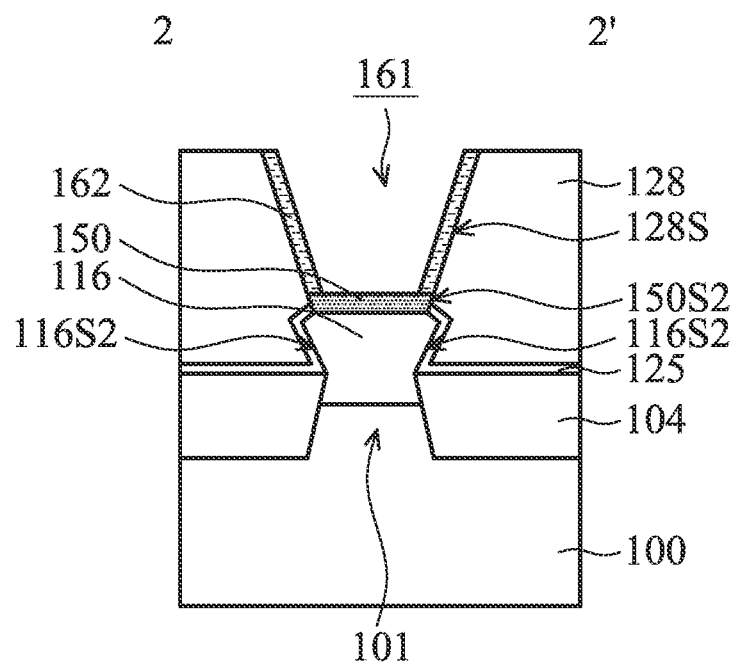

Afterwards, in some embodiments, spacers 162 are formed in the openings 161 to cover and be in direct contact with the exposed sidewalls of the spacer layers 126, as shown in FIG. 2K, and sidewalls of the openings 161 constituted by the insulating layer 128, as shown in FIG. 3H. For example, the spacer 162 may be separated from the spacer 114 by the spacer 126 in the transversal direction of the gate electrode layer 124, as shown in FIG. 2K. Moreover, the spacer 162 is in direct contact with the insulating layer 128 in the longitudinal direction of the gate electrode layer 124, as shown in FIG. 3H.

In some embodiments, the spacers 162 are made of an insulating material different from that of the spacers 126. For example, the spacers 162 may be made of silicon nitride, silicon oxide, silicon oxynitride, silicon carbide, or another applicable dielectric material. After the spacers 162 are formed, the spacer 126 is covered by the spacer 162 and the spacer 114 is covered by the spacer 126. The interface between the spacer 162 and the spacer 126 is substantially aligned to the first side edge 150S1 of the silicide region 150 (as indicated in FIG. 2F), and the interface between the 126 spacer and the spacer 114 is substantially aligned to the first side edge 116S1 of the source/drain region 116 (as indicated in FIG. 2F), as shown in FIG. 2K. Moreover, the interface between the spacer 162 and the sidewall of the opening 161 constituted by the insulating layer 128 is substantially aligned to the second side edge 150S2 of the silicide region 150 (as indicated in FIG. 3C), as shown in FIG. 3H.

Figure 2L:
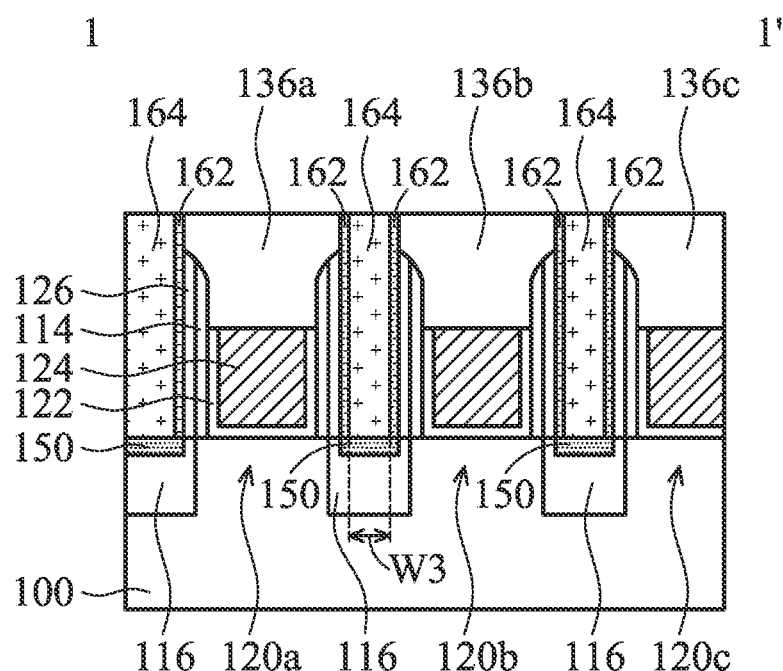
Figure 3I:
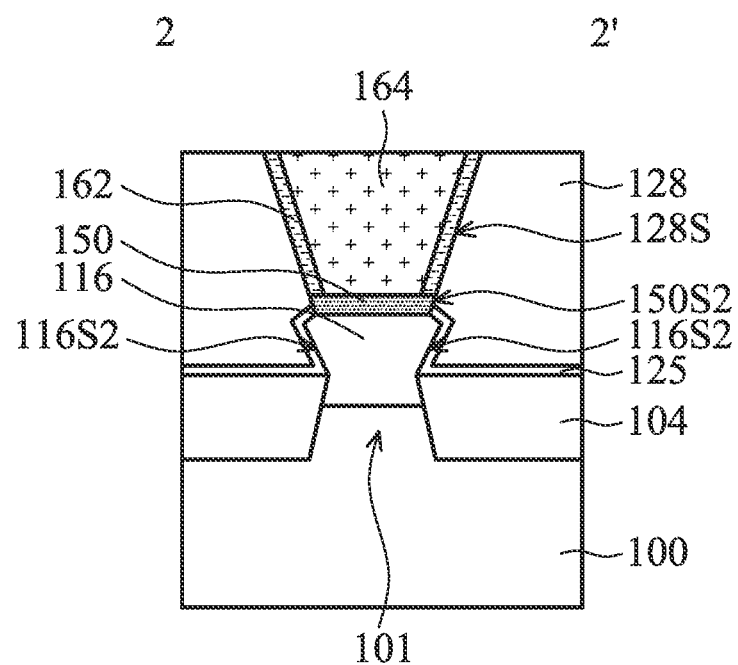

After the spacers 162 are formed in the openings 161, source/drain contact structures 164 fill the openings 161, respectively, as shown in FIGS. 2L and 3I in accordance with some embodiments. Each of the source/drain contact structures 164 is surrounded by a corresponding spacer 162 and electrically connected to a corresponding source/drain region 116 through a corresponding silicide region 150. The silicide region 150 is formed prior to the formation of the spacers 162. Therefore, the bottom of the spacer 162 is entirely covered by the corresponding silicide region 150, so as to be separated from the source/drain region 116 by the silicide region 150. Moreover, since the source/drain contact structures 164 is formed after the spacers 162 are formed, the top width W2 of the silicide region 150 (as indicated in FIG. 2F) is greater than the bottom width W3 of the source/drain contact structure 164. As a result, the parasitic resistance (Re) induced by the silicide region 150 is reduced while keeping the critical dimension (CD) of the source/drain contact structure 164.

In some embodiments, the source/drain contact structure 164 is made of Co, Ru, W, Cu, or the like. The formation of the source/drain contact structure 164 may include forming a metal material (not shown) over the structure shown in FIGS. 2K and 3H and filling the openings 161 by a chemical vapor deposition (CVD) process, a physical vapor deposition, (PVD) process, an atomic layer deposition (ALD) process, an electroless deposition (ELD) process, an electrochemical plating (ECP) process, or another applicable process. Afterwards, a planarization process is performed to remove the excess metal material above the insulating capping layers 136a, 136b, 136c, and 136d (which is not shown in FIG. 2L), in accordance with some embodiments. In some embodiments, the planarization process includes a chemical mechanical polishing (CMP) process.

After the planarization process, the remaining metal material forms the source/drain contact structure 164 between and adjacent to the gate structures including the gate stacks 120a, 120b, 120c, and 120d (which is not shown in FIG. 2L), as shown in FIG. 2L. Those source/drain contact structure 164 are electrically connected to the corresponding source/drain regions 116, and separated from the gate stacks by the spacers 114, 126 and 162 that are formed over opposing sidewalls of the gate stacks 120a, 120b, 120c, and 120d. Moreover, the upper surface of the source/drain contact structure 164 is substantially level with the upper surface of the insulating capping layers 136a, 136b, 136c, and 136d.

Although the semiconductor device structure formed by the methods shown in FIGS. 2A to 2L and 3A to 3I includes the formation and the patterning of the sacrificial layer 152 and the hard mask structure including a first masking layer 154, a second masking layer 156, and a third masking layer 158 after the silicide region 150 is formed, embodiments of the disclosure are not limited thereto. Many variations and/or modifications can be made to embodiments of the disclosure. For example, the formation of the sacrificial layer 152 and the hard mask structure are omitted.

Figures 1, 2G:
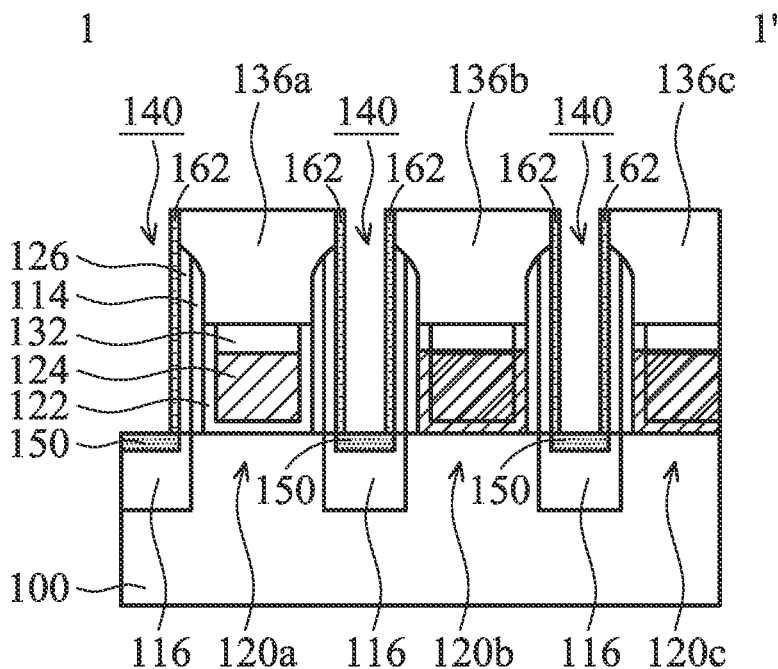
Figures 1, 2H:
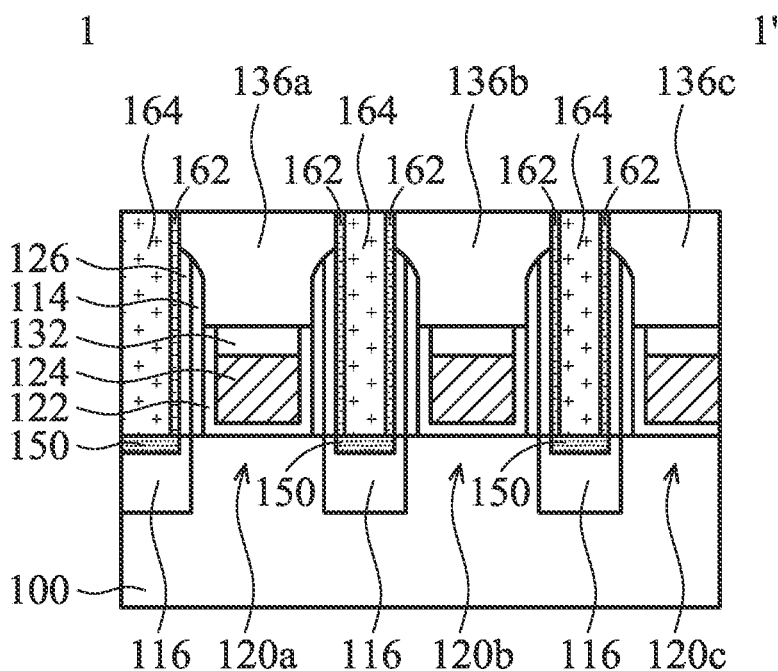

FIGS. 2G-1 and 2H-1 illustrate cross-sectional representations of various stages of manufacturing a semiconductor device structure in accordance with some embodiments. In some embodiments, a structure shown in FIG. 2F is provided, and spacers 162 are formed in the openings 140 to cover and be in direct contact with the exposed sidewalls of the spacer layers 126, as shown in FIG. 2G-1, and sidewalls of the openings 161 constituted by the insulating layer 128 (not shown and referred to FIG. 3H).

After the spacers 162 are formed in the openings 140, source/drain contact structures 164 fill the openings 140, respectively, as shown in FIG. 2H-1 in accordance with some embodiments. Each of the source/drain contact structures 164 is electrically connected to a corresponding source/drain region 116 through a corresponding silicide region 150.

Embodiments of semiconductor device structures and methods for forming the same are provided. The formation of the semiconductor device structure includes forming a gate electrode layer, a first spacer layer, and a second spacer over a semiconductor substrate with a source/drain region therein and forming a silicide region in the source/drain region. Afterwards, a source/drain contact structure is formed over the source/drain region. In the semiconductor device structure, the first spacer and the second spacer are laterally and successively arranged from the sidewall of the gate electrode layer to the source/drain contact structure. Moreover, the silicide region is formed prior to the formation of the second spacer and is self-aligned to the first spacer, so that the bottom of the second spacer is covered by the silicide region. As a result, the top width of the silicide region is greater than the bottom width of the source/drain contact structure and less than the top width of the source/drain region. Therefore, the semiconductor device structure has a lower parasitic resistance (Re) induced by the silicide region than the case where the top width of the silicide region is equal to the bottom width of the source/drain contact structure when the critical dimension (CD) of the source/drain contact structure is not increased or changed. Moreover, such a semiconductor device structure with lower parasitic resistance (Re) also has a lower parasitic capacitance ($R_c$) between the gate electrode layer and the source/drain contact structure than the case where the top width of the silicide region less than the top width of the source/drain region.

In some embodiments, a semiconductor device structure is provided. The semiconductor device structure includes a source/drain region formed in a semiconductor substrate, a source/drain contact structure formed over the source/drain region, and a gate electrode layer formed over the semiconductor substrate and adjacent to the source/drain contact structure. The semiconductor device structure also includes a first spacer and a second spacer laterally and successively arranged from the sidewall of the gate electrode layer to the sidewall of the source/drain contact structure. The sidewall of the first spacer is substantially aligned to the first side edge of the source/drain region extending in the longitudinal direction of the gate electrode layer. The semiconductor device structure further includes a silicide region formed in the source/drain region. The top width of the silicide region is greater than the bottom width of the source/drain contact structure and less than the top width of the source/drain region.

In some embodiments, a semiconductor device structure is provided. The semiconductor device structure includes a conductive feature formed in a fin structure of a semiconductor substrate. The conductive feature has a first side edge extending in a first direction and a second side edge extending in a second direction that is orthogonal to the first direction. The semiconductor device structure also includes an insulating layer formed over the semiconductor substrate and adjacent to the second side edge of the conductive feature. The semiconductor device structure further includes a conductive contact structure formed in the insulating layer and corresponding to the conductive feature. In addition, the semiconductor device structure includes a silicide region formed between and electrically connected to the conductive contact structure and the conductive feature. The silicide region has a first side edge extending in the first direction and a second side edge extending in the second direction. The second side edge of the silicide region is in direct contact with the insulating layer.

In some embodiments, a method for forming a semiconductor device structure is provided. The method includes forming an insulating layer over a semiconductor substrate with a fin structure. The fin structure has a source/drain region. The method also includes forming a first gate structure and a second gate structure in the first insulating layer and across the fin structure on both sides of the source/drain region. Each of the first gate structure and the second gate structure includes a gate stack; a first spacer covering the sidewall of the gate stack, and a second spacer covering the sidewall of the first spacer. The method further includes forming an opening in the insulating layer between the first gate structure and the second gate structure to expose the top surface of the source/drain region and the sidewall of the second spacer layer. In addition, the method includes forming a silicide region on the exposed top surface of the source/drain region and forming a third spacer in the opening to cover the exposed sidewall of the second spacer layer and sidewalls of the opening constituted by the insulating layer. The method also includes forming a source/drain contact structure in the opening having the third spacer.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a source/drain region formed in a semiconductor substrate;
a source/drain contact structure formed over the source/drain region;
a gate electrode layer formed over the semiconductor substrate and adjacent to the source/drain contact structure;
a first spacer and a second spacer both between the gate electrode layer and the source/drain contact structure, in isolation from one another and laterally and successively arranged from a sidewall of the gate electrode layer to a sidewall of the source/drain contact structure, wherein a sidewall of the first spacer is substantially aligned to a first side edge of the source/drain region extending in a longitudinal direction of the gate electrode layer; and
a silicide region formed in the source/drain region, wherein a top width of the silicide region is greater than a bottom width of the source/drain contact structure and less than a top width of the source/drain region.

2. The semiconductor device structure as claimed in claim 1, further comprising a third spacer arranged between the first spacer and the second spacer.

3. The semiconductor device structure as claimed in claim 2, wherein a sidewall of the third spacer is substantially aligned to a side edge of the silicide region extending in the longitudinal direction of the gate electrode layer.

4. The semiconductor device structure as claimed in claim 1, further comprising an insulating layer formed over the semiconductor substrate and adjacent to the source/drain contact structure.

5. The semiconductor device structure as claimed in claim 4, wherein a sidewall of the insulating layer is substantially aligned to a side edge of the silicide region extending in a transversal direction of the gate electrode layer.

6. The semiconductor device structure as claimed in claim 4, wherein a side edge of the silicide region extending in the transversal direction of the gate electrode layer is in direct contact with the insulating layer.

7. The semiconductor device structure as claimed in claim 4, wherein the second spacer is in direct contact with the insulating layer and is separated from the first spacer.

8. The semiconductor device structure as claimed in claim 4, wherein a second side edge of the source/drain region extending in a transversal direction of the gate electrode layer is adjacent to the insulating layer.

9. A semiconductor device structure, comprising:
a conductive feature formed in a fin structure of a semiconductor substrate, wherein the conductive feature has a first side edge extending in a first direction and a second side edge extending in a second direction that is orthogonal to the first direction;

an insulating layer formed over the semiconductor substrate and adjacent to the second side edge of the conductive feature;

a conductive contact structure formed in the insulating layer and corresponding to the conductive feature;

a first insulating spacer formed in the insulating layer and surrounding the conductive contact structure; and a silicide region formed between and electrically connected to the conductive contact structure and the conductive feature, wherein the silicide region has a first side edge extending in the first direction and a second side edge extending in the second direction, and wherein the second side edge of the silicide region is in direct contact with a bottom of the insulating layer and a bottom of the first insulating spacer.

10. The semiconductor device structure as claimed in claim 9, wherein the bottom of the first insulating spacer is separated from the conductive feature by the silicide region.

11. The semiconductor device structure as claimed in claim 9, wherein an interface between the first insulating spacer and the insulating layer is substantially aligned to the second side edge of the silicide region.

12. The semiconductor device structure as claimed in claim 9, wherein the first side edge of the conductive feature is laterally extended beyond the first side edge of the silicide region, and the second side edge of the conductive feature is laterally extended beyond the second side edge of the silicide region.

13. The semiconductor device structure as claimed in claim 9, wherein the conductive feature is an epitaxial source/drain region formed in the fin structure.

14. The semiconductor device structure as claimed in claim 9, further comprising:

a second insulating spacer covered by the first insulating spacer; and a third insulating spacer covered by the second insulating spacer, wherein a first interface between the first insulating spacer and the second insulating spacer is substantially aligned to a first side edge of the silicide region, and wherein a second interface between the second insulating spacer and the third insulating spacer is substantially aligned to a first side edge of the conductive feature.

15. A method for forming a semiconductor device structure, comprising:

forming an insulating layer over a semiconductor substrate with a fin structure, wherein the fin structure has a source/drain region;

forming a first gate structure and a second gate structure in the insulating layer and across the fin structure on both sides of the source/drain region, wherein each of the first gate structure and the second gate structure comprises:

a gate stack;

a first spacer covering a sidewall of the gate stack; and a second spacer covering a sidewall of the first spacer;

forming an opening in the insulating layer between the first gate structure and the second gate structure to expose a top surface of the source/drain region and a sidewall of the second spacer layer;

forming a silicide region on the exposed top surface of the source/drain region;

forming a third spacer in the opening to cover the exposed sidewall of the second spacer layer and sidewalls of the opening constituted by the insulating layer; and forming a source/drain contact structure in the opening having the third spacer.

16. The method as claimed in claim 15, wherein the sidewall of the first spacer is substantially aligned to a side edge of the source/drain region that extends in a longitudinal direction of the gate stack.

17. The method as claimed in claim 15, wherein the sidewall of the second spacer is substantially aligned to a side edge of the silicide region that extends in the longitudinal direction of the gate stack.

18. The method as claimed in claim 15, wherein a side edge of the source/drain region and a side edge of the silicide region that extend in a longitudinal direction of the gate stack are separated from each other by a distance, and wherein the distance is substantially equal to a bottom width of the second spacer in a transversal direction of the gate stack.

19. The semiconductor device structure as claimed in claim 1, wherein the first side edge of the source/drain region defines a portion of an interface between the source/drain region and the semiconductor substrate.

20. The method as claimed in claim 15, further comprising:

forming a sacrificial layer in the opening after forming the silicide region; and removing the sacrificial layer before forming the third spacer.

* * * * *